US008592252B2

(12) United States Patent
Bathan et al.

(10) Patent No.: US 8,592,252 B2
(45) Date of Patent: *Nov. 26, 2013

(54) SEMICONDUCTOR DEVICE AND METHOD OF FORMING THROUGH HOLE VIAS IN DIE EXTENSION REGION AROUND PERIPHERY OF DIE

(75) Inventors: Henry Descalzo Bathan, Singapore (SG); Zigmund Ramirez Camacho, Singapore (SG); Lionel Chien Hui Tay, Singapore (SG); Arnel Senosa Trasporto, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 466 days.

This patent is subject to a terminal disclaimer.

(21) Appl. No.: 12/858,593

(22) Filed: Aug. 18, 2010

(65) Prior Publication Data

US 2010/0308467 A1      Dec. 9, 2010

Related U.S. Application Data

(63) Continuation of application No. 11/947,377, filed on Nov. 29, 2007, now Pat. No. 7,790,576.

(51) Int. Cl.
*H01L 21/50* (2006.01)
*H01L 21/78* (2006.01)

(52) U.S. Cl.
USPC ........... 438/106; 438/107; 438/462; 438/113; 438/458; 438/127; 257/773; 257/E21.499; 257/E21.599

(58) Field of Classification Search
USPC ........ 438/15, 25–28, 51, 55, 64–68, 106–127
See application file for complete search history.

(56) References Cited

U.S. PATENT DOCUMENTS

| | | | | | |
|---|---|---|---|---|---|
| 5,950,070 | A | * | 9/1999 | Razon et al. | 438/113 |
| 6,420,244 | B2 | * | 7/2002 | Lee | 438/458 |
| 6,852,607 | B2 | | 2/2005 | Song et al. | |
| 2005/0046002 | A1 | | 3/2005 | Lee et al. | |
| 2005/0158009 | A1 | | 7/2005 | Eichelberger et al. | |
| 2006/0208356 | A1 | | 9/2006 | Yamano et al. | |
| 2006/0252178 | A1 | * | 11/2006 | Yang | 438/106 |
| 2009/0008793 | A1 | * | 1/2009 | Pohl et al. | 257/777 |

* cited by examiner

*Primary Examiner* — Mamadou Diallo
(74) *Attorney, Agent, or Firm* — Robert D. Atkins; Patent Law Group: Atkins & Associates, P.C.

(57) ABSTRACT

A semiconductor wafer contains a plurality of semiconductor die. The semiconductor wafer is diced to separate the semiconductor die. The semiconductor die are transferred onto a carrier. A die extension region is formed around a periphery of the semiconductor die on the carrier. The carrier is removed. A plurality of through hole vias (THV) is formed in first and second offset rows in the die extension region. A conductive material is deposited in the THVs. A first RDL is formed between contact pads on the semiconductor die and the THVs. A second RDL is formed on a backside of the semiconductor die in electrical contact with the THVs. An under bump metallization is formed in electrical contact with the second RDL. Solder bumps are formed on the under bump metallization. The die extension region is singulated to separate the semiconductor die.

25 Claims, 20 Drawing Sheets

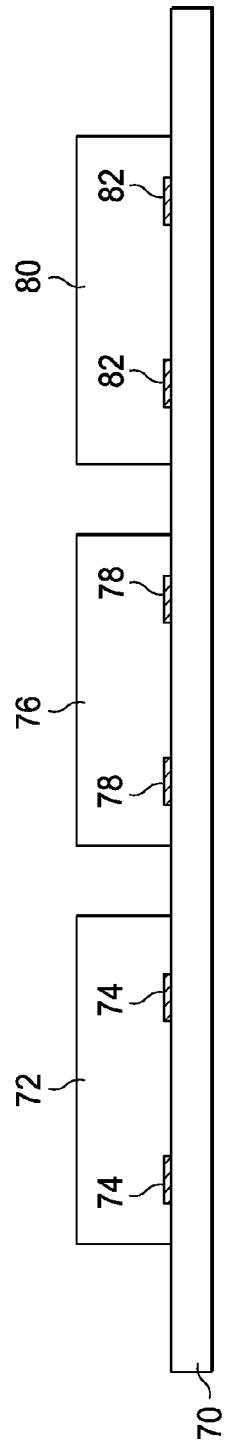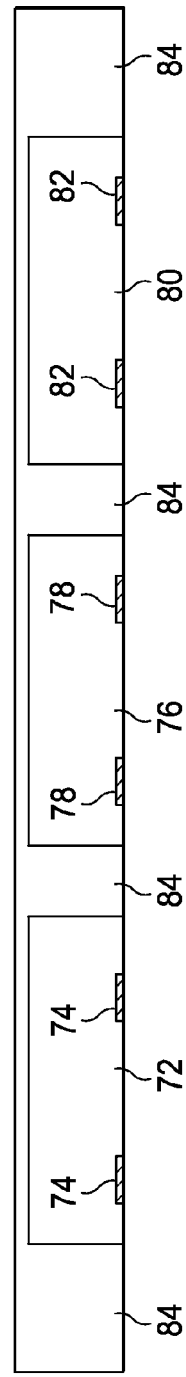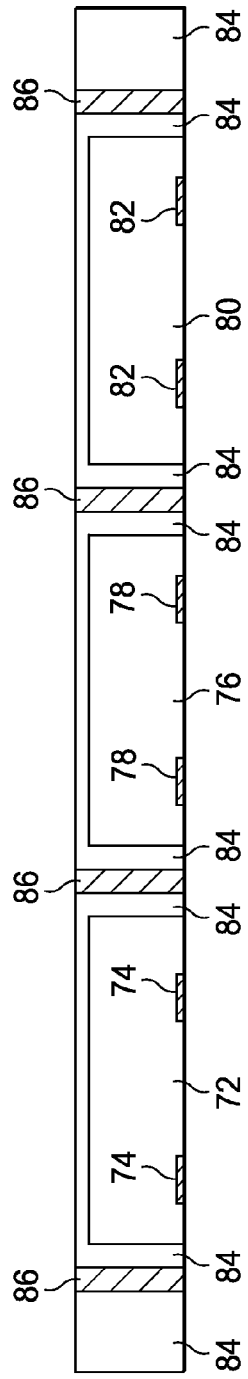

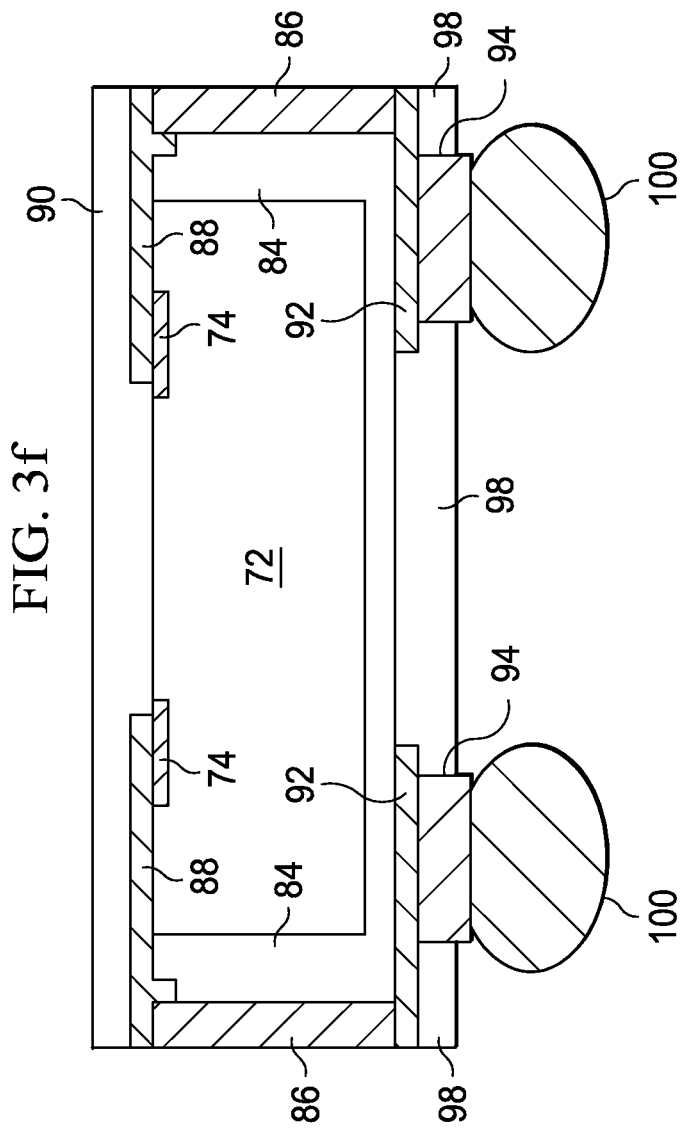

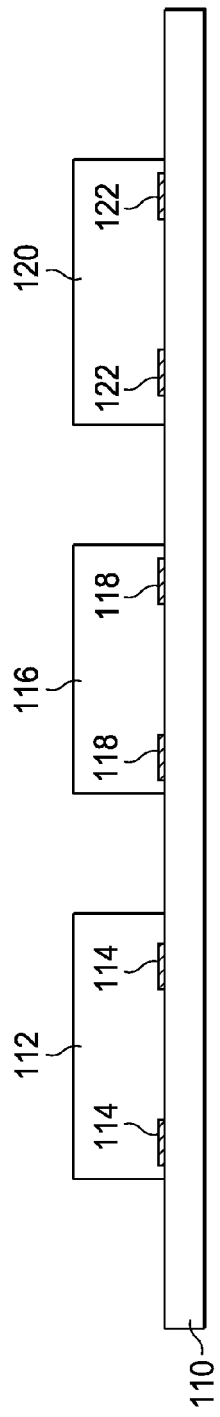
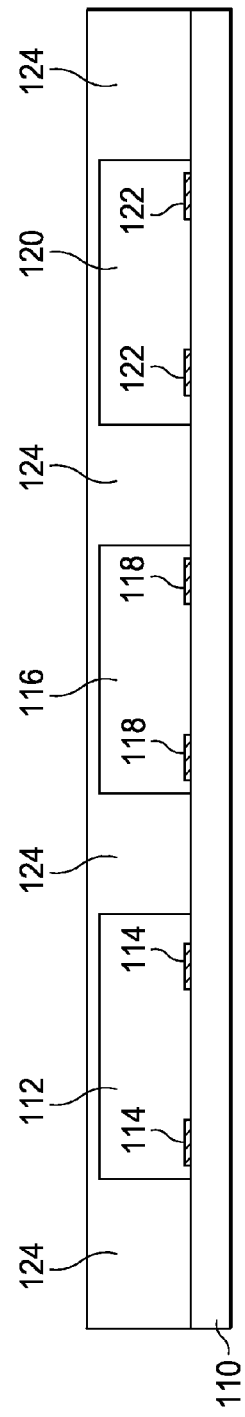
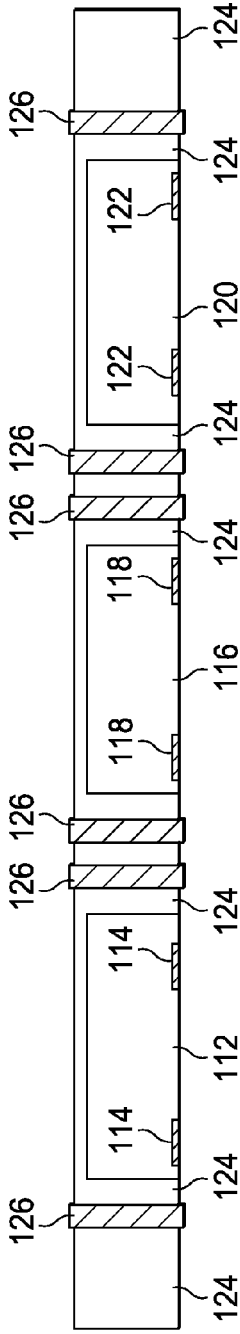

FIG. 4f

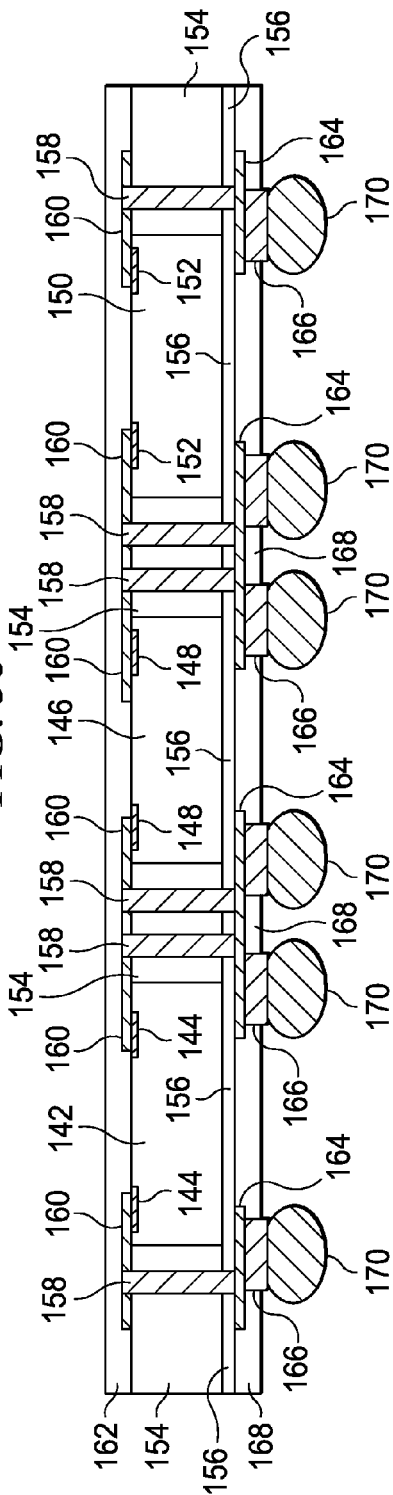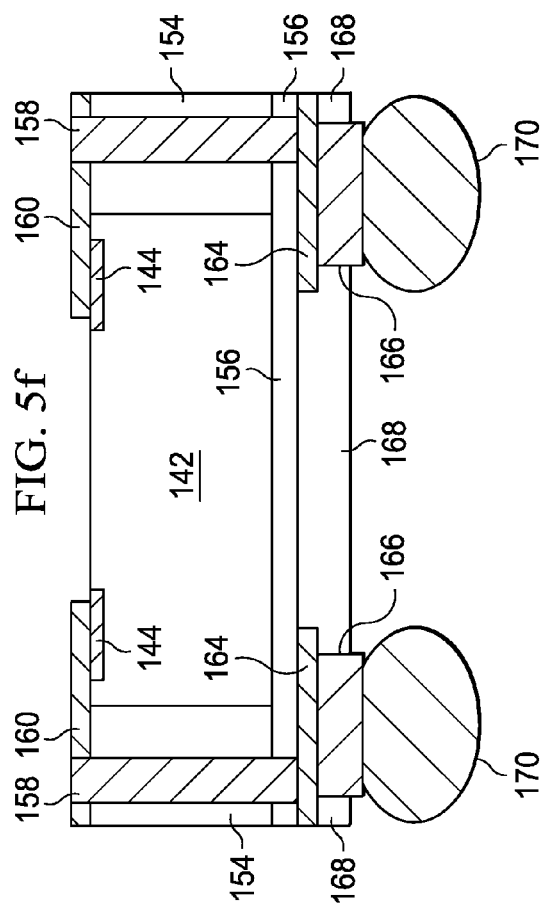

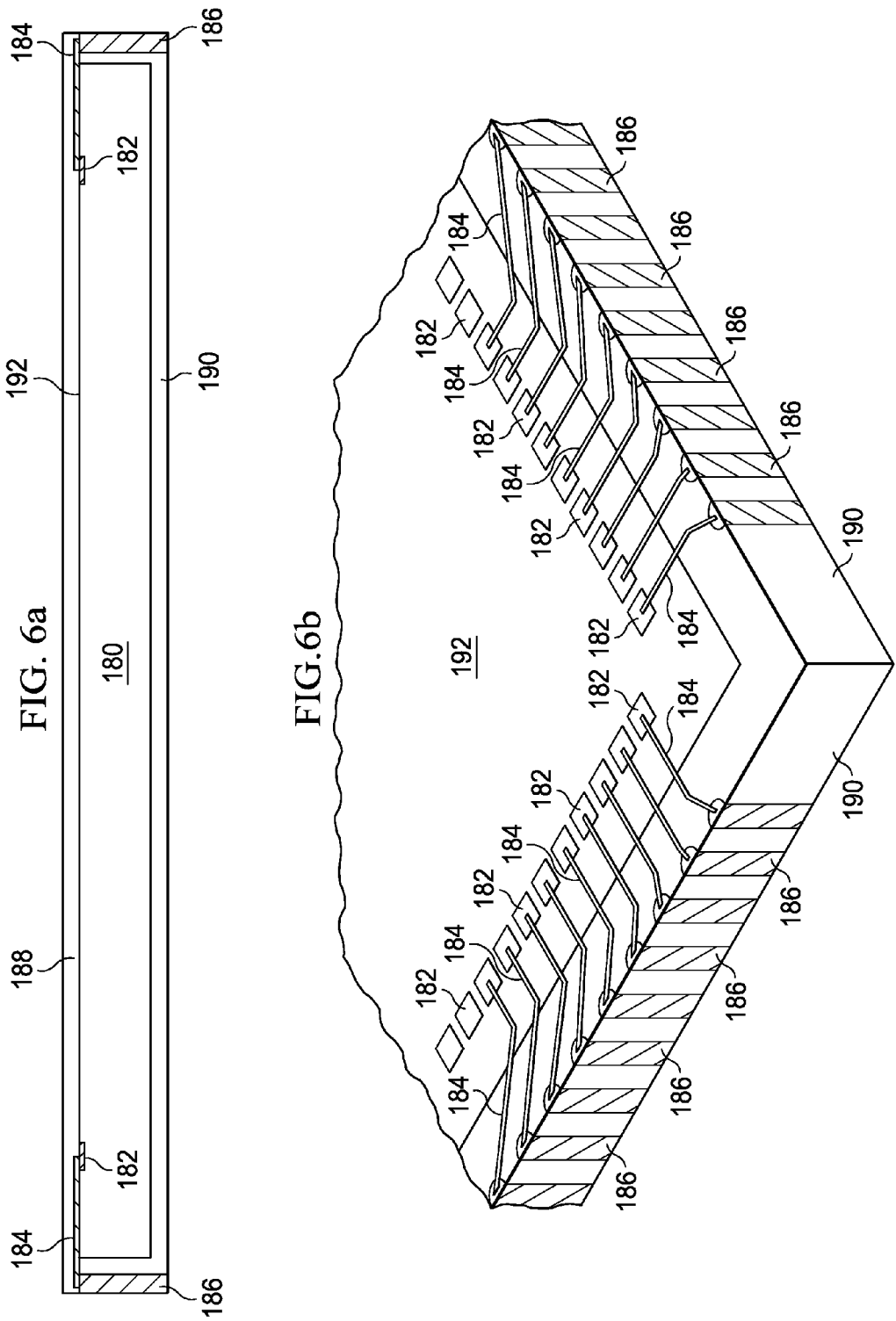

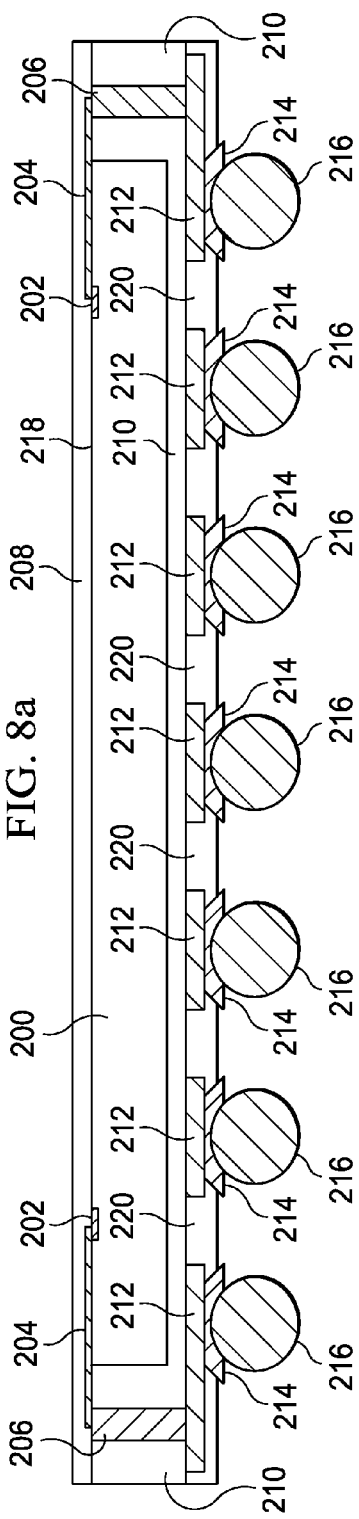
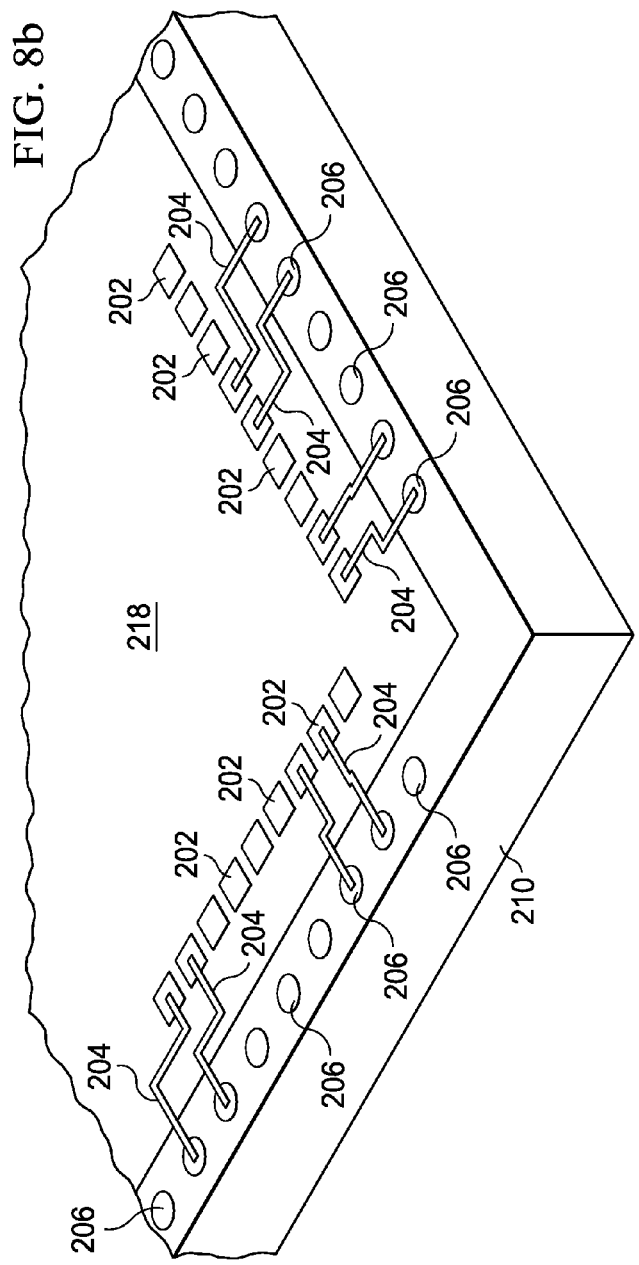

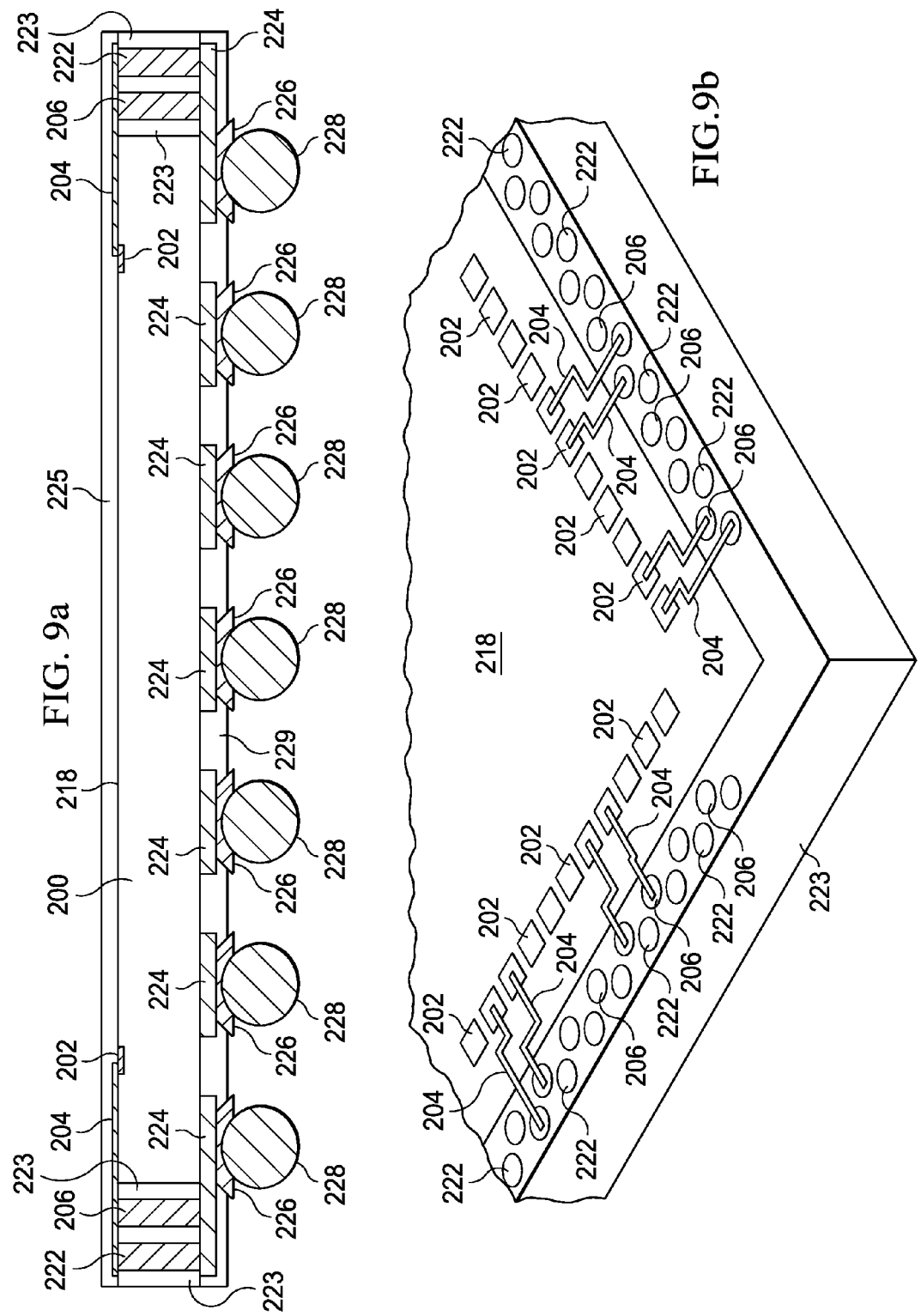

SEMICONDUCTOR DEVICE AND METHOD OF FORMING THROUGH HOLE VIAS IN DIE EXTENSION REGION AROUND PERIPHERY OF DIE

CLAIM OF DOMESTIC PRIORITY

The present application is a continuation of U.S. patent application Ser. No. 11/947,377, filed Nov. 29, 2007, and claims priority to the foregoing parent application pursuant to 35 U.S.C. §120.

FIELD OF THE INVENTION

The present invention relates in general to semiconductor devices and, more particularly, to a semiconductor device having through hole vias formed in a die extension region around a periphery of the die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done with through hole vias which traverse from front side to the backside of the die. The through hole vias are formed by drilling through the active area of the die or through saw streets on the wafer prior to any dicing operation. The process of drilling through hole vias in the active area of the die or in saw streets on the wafer can cause damage to the wafer and/or die.

A need exists to interconnect stacked semiconductor die without drilling through hole vias in the active area of the die or in saw streets on the wafer.

SUMMARY OF THE INVENTION

In one embodiment, the present invention is a method of making a semiconductor device comprising the steps of providing a carrier, mounting a plurality of semiconductor die to the carrier, forming a die extension region including a polymer material around a periphery of the semiconductor die, forming a plurality of vias through the die extension region, depositing conductive material in the vias, forming a first conductive layer between contact pads over an active surface of the semiconductor die and the conductive vias, forming a second conductive layer over a back surface of the semiconductor die, opposite the active surface, electrically connected to the conductive vias, forming an interconnect structure over the back surface of the semiconductor die electrically connected to the second conductive layer, and singulating through the conductive vias in the die extension region to separate the semiconductor die.

In another embodiment, the present invention is a method of making a semiconductor device comprising the steps of providing a carrier, mounting a plurality of semiconductor die to the carrier, forming a die extension region including an insulating material around a periphery of the semiconductor die, forming a plurality of conductive vias through the die extension region, forming a first conductive layer over an active surface of the semiconductor die electrically connected to the conductive vias, and singulating through the conductive vias in the die extension region to separate the semiconductor die.

In another embodiment, the present invention is a method of making a semiconductor device comprising the steps of providing a semiconductor die, forming a die extension region including an insulating material around the semiconductor die, forming a plurality of conductive vias through the die extension region, and forming a first conductive layer over an active surface of the semiconductor die electrically connected to the conductive vias.

In another embodiment, the present invention is a semiconductor device comprising a semiconductor die with a die extension region including an insulating material formed around a periphery of the semiconductor die. A plurality of conductive vias is formed through the die extension region. A first conductive layer is formed over an active surface of the semiconductor die electrically connected to the conductive vias.

BRIEF DESCRIPTION OF THE DRAWINGS

FIGS. 3a-3f illustrate formation of THVs in a die extension region around a periphery of the die using a die sinking on epoxy adhesive sheet;

FIGS. 4a-4f illustrate formation of THVs in a die extension region around a periphery of the die using diced wafer expansion and lamination;

FIGS. 5a-5f illustrate formation of THVs in a die extension region around a periphery of the die using diced wafer expansion, kerf filling, and lamination;

FIGS. 6a-6c illustrate a semiconductor package with through hole half vias formed in a die extension region around a periphery of the die;

FIGS. 8a-8b illustrate a semiconductor package with through hole full vias formed in a die extension region around a periphery of the die;

FIGS. 9a-9b illustrate a semiconductor package with through hole full vias formed as offset rows in a die extension region around a periphery of the die;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
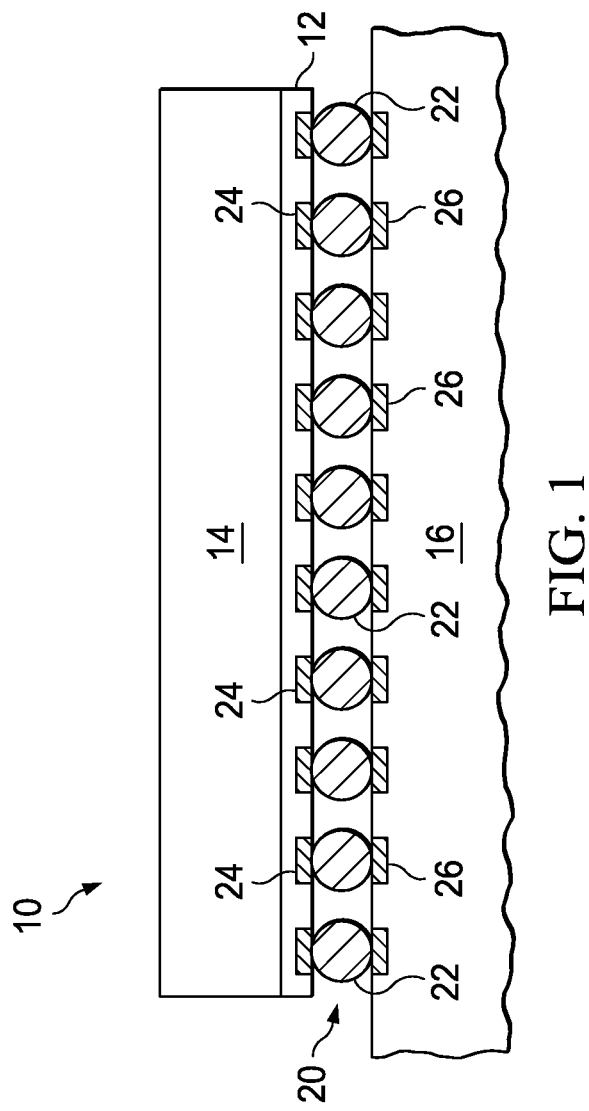
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2a-2e illustrate a process of forming through hole vias (THVs) on a periphery of a semiconductor die in a wafer level chip scale package (WLCSP) using a transfer molding compound. The THVs are formed through a non-conductive passivation or polymer die extension region, as described hereinafter.

Figure 2A:
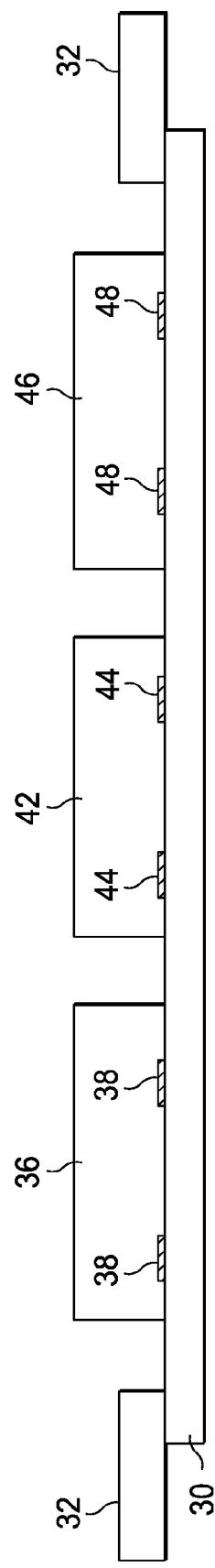
FIGS. 2a-2e illustrate a process of forming THVs in a die extension region around a periphery of the die using a transfer molding compound.

To start the process, the semiconductor die are formed on a semiconductor wafer using conventional integrated circuit processes, as described above. The semiconductor wafer is diced to separate the semiconductor die into individual units. The semiconductor die are then transferred onto a temporary chip carrier. In one embodiment, FIG. 2a shows coverlay tape 30 disposed between ends of chip carrier 32. Semiconductor die 36 is transferred and affixed to coverlay tape 30 with its active surface and contact pads 38 oriented face down onto the tape. Likewise, semiconductor die 42 is transferred and affixed to coverlay tape 30 with its active surface and contact pads 44 oriented face down onto the tape, and semiconductor die 46 is transferred and affixed to coverlay tape 30 using die attach material with its active surface and contact pads 48 oriented face down on the tape. Semiconductor die 36, 42, and 46 can also be mounted to coverlay tape 30 using post wafer saw tape transfer.

Figure 2B:
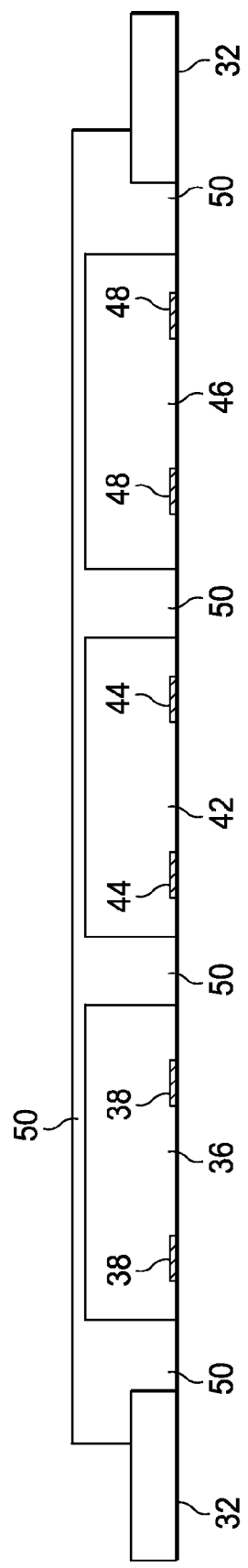

In FIG. 2b, a transfer polymer molding compound 50 is deposited around a periphery of semiconductor die 36, 42, and 46 down to coverlay tape 30. The polymer molding compound 50 forms a non-conductive die extension region around a periphery of semiconductor die 36, 42, and 46. The coverlay tape is then peeled away to expose the contact pads and active front side of semiconductor die 36, 42, and 46.

Figure 2C:
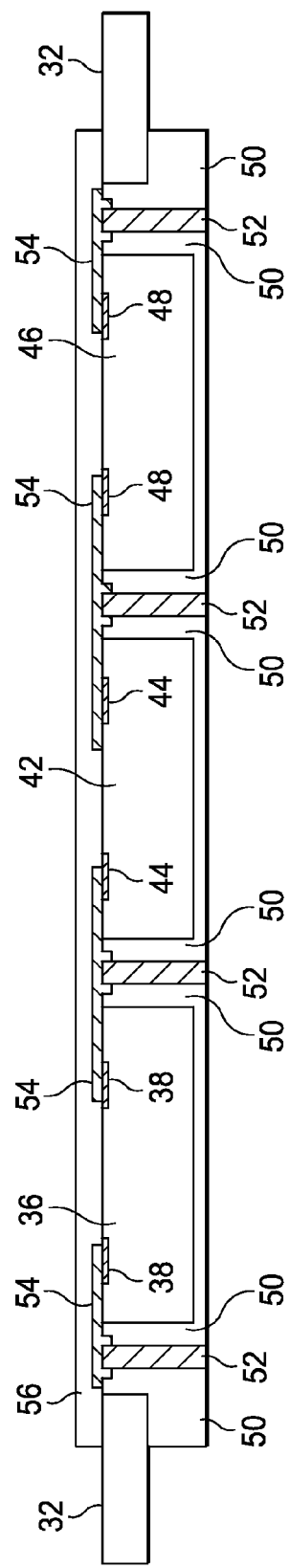

In FIG. 2c, the semiconductor die are inverted such that the contact pads and active front side of semiconductor die 36, 42, and 46 face upward. THVs 52 are formed in the die extension region between semiconductor die 36, 42, and 46 by etching, laser drilling or by any known conventional methods. An electrically conductive material is deposited in THVs 52 using an evaporation, electrolytic plating, electroless plating, or screen printing process. The conductive material can be aluminum (Al), copper (Cu), tin (Sn), nickel (Ni), gold (Au), or silver (Ag). A redistribution layer (RDL) 54 is formed between THVs 52 and the respective contact pads 38, 44, and 48 of semiconductor die 36, 42, and 46. RDLs 54 can be made with Al, aluminum copper alloy (AlCu), Cu, or Cu alloy. RDLs 54 operate as an intermediate conduction layer to route electrical signals between THVs 52 and contact pads 38, 44, and 48. A passivation layer 56 is formed over RDLs 54, contact pads 38, 44, and 48, and semiconductor die 36, 42, and 46 for structural support and electrical isolation. Passivation layer 56 can be made with silicon dioxide (SiO2), silicon oxynitride (SiON), silicon nitride (SixNy), polyimide (PI), benzocyclobutene (BCB), polybenzoxazole (PBO), or other insulating material.

Figure 2D:
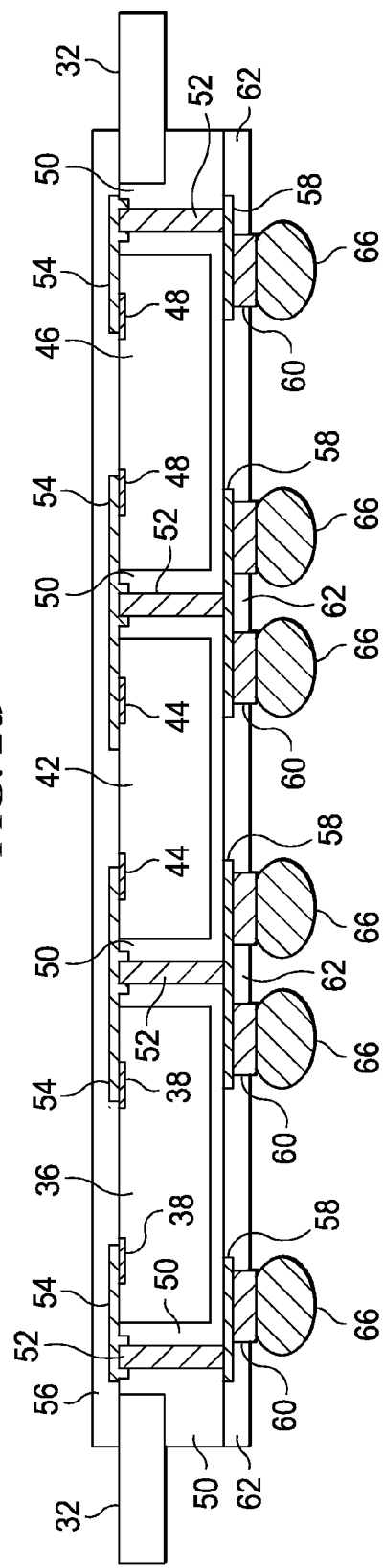

In FIG. 2d, RDLs 58 are formed on a backside of the semiconductor die, opposite the active front side of the die, and electrically contact the backside of THVs 52. RDLs 54 can be made with Al, AlCu, Cu, or Cu alloy. An under bump metallization (UBM) 60 is deposited and patterned to electrically contact RDLs 58. In one embodiment, UBMs 60 may include a wetting layer, barrier layer, and adhesive layer. RDLs 58 operate as an intermediate conduction layer to route electrical signals between THVs 52 and UBMs 60. A passivation layer 62 is formed over RDLs 58 and transfer molding compound 50 for structural support and electrical isolation. Passivation layer 62 can be made with SiO2, SiON, SixNy, PI, BCB, PBO, or other insulating material.

An electrically conductive solder material is deposited over UBMs 60 through an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi) and alloys thereof. In one embodiment, the solder material is 63 percent weight of Sn and 37 percent weight of Pb. The solder material is reflowed by heating the conductive material above its melting point to form spherical balls or bumps 66. In some applications, solder bumps 66 are reflowed a second time to improve electrical contact to UBMs 60. UBMs 60 and solder bumps 66 represent one type of interconnect structure.

Semiconductor die 36, 42, and 46 are singulated along the die extension region. The die extension region is cut by a cutting tool such as a saw or laser. The cutting tool completely severs the die extension region to separate the die.

Figure 2E:
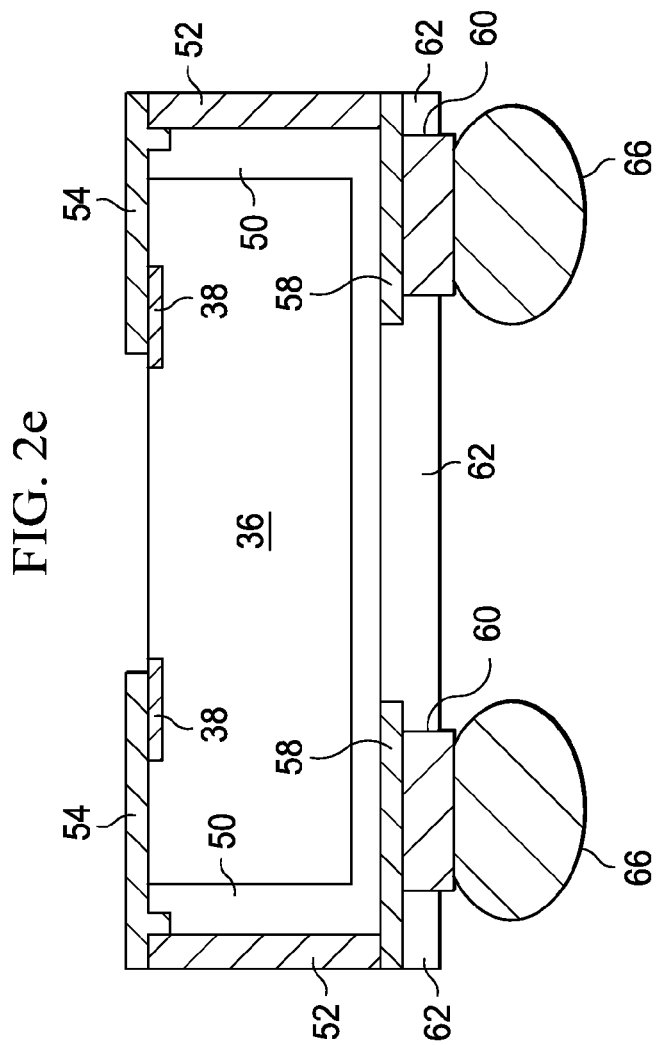

FIG. 2e illustrates semiconductor die 36 following singulation of the die extension region through a center area of THVs 52. Each semiconductor die has a similar final configuration. Contact pads 38 electrically connect through RDLs 54, THVs 52, RDLs 58, and UBMs 60 to solder bumps 66, as shown in FIG. 2e.

Figure 3D:
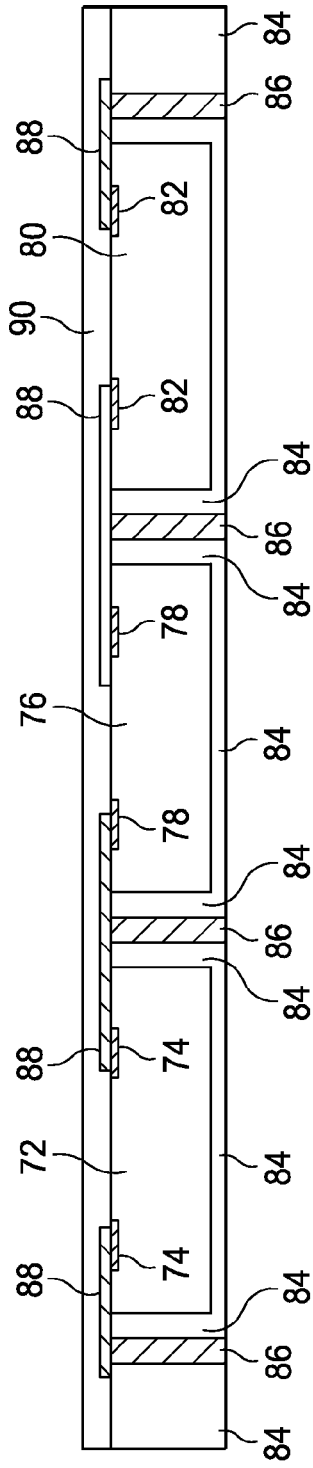

FIGS. 3a-3f illustrate an alternate embodiment of forming THVs on a periphery of a semiconductor die in a WLCSP, in this case using a die sinking on an epoxy adhesive sheet. In FIG. 3a, the wafer is diced and semiconductor die 72, 76, and 80 are transferred to carrier tape 70 with contact pads 74, 78, and 82 facing down toward the carrier tape.

In FIG. 3b, a lamination or encapsulation molding compound 84 is deposited around a periphery of semiconductor die 72, 76, and 80 and cured. The molding compound 84 forms a die extension region around the periphery of semiconductor die 72, 76, and 80. The encapsulation molding compound 84 can be made with epoxy acrylate or other polymer material. The carrier tape 70 is removed.

In FIG. 3c, THVs 86 are formed in the die extension region around a periphery of semiconductor die 72, 76, and 80. An electrically conductive material is deposited in THVs 86 using an evaporation, electrolytic plating, electroless plating, or screen printing process. The conductive material can be Al, Cu, Sn, Ni, Au, or Ag.

In FIG. 3d, the semiconductor die are inverted such that the contact pads and active front side of semiconductor die 72, 76, and 80 face upward. RDLs 88 are formed between THVs 86 and the respective contact pads 74, 78, and 82 of semiconductor die 72, 76, and 80. RDLs 88 can be made with Al, AlCu, Cu, or Cu alloy. RDLs 88 operate as an intermediate conduction layer to route electrical signals between THVs 86 and contact pads 74, 78, and 82. A passivation layer 90 is formed over RDLs 88, contact pads 74, 78, and 82, and semiconductor die 72, 76, and 80 for structural support and electrical isolation. Passivation layer 90 can be made with SiO2, SiON, SixNy, PI, BCB, PBO, or other insulating material.

Figure 3E:
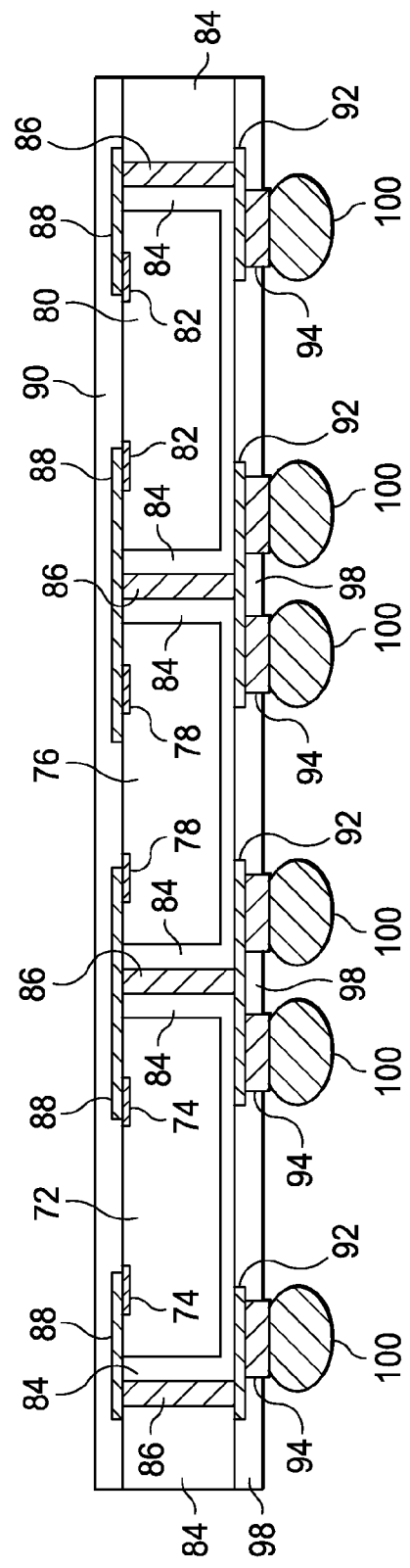

In FIG. 3e, RDLs 92 are formed on a backside of the semiconductor die, opposite the active front side, and electrically contact the backside of THVs 86. RDLs 92 can be made with Al, AlCu, Cu, or Cu alloy. A UBM 94 is deposited and patterned to electrically contact RDLs 92. In one embodiment, UBMs 94 may include a wetting layer, barrier layer, and adhesive layer. RDLs 92 operate as an intermediate conduction layer to route electrical signals between THVs 86 and UBMs 94. A passivation layer 98 is formed over RDLs 92 and encapsulation molding compound 84 for structural support and electrical isolation. Passivation layer 98 can be made with SiO2, SiON, SixNy, PI, BCB, PBO, or other insulating material.

An electrically conductive solder material is deposited over UBMs 94 through an evaporation, electrolytic plating, electroless plating, ball drop, or screen printing process. The solder material can be any metal or electrically conductive material, e.g., Sn, Pb, Ni, Au, Ag, Cu, Bi and alloys thereof. The solder material is reflowed by heating the conductive material above its melting point to form spherical balls or bumps 100. In some applications, solder bumps 100 are reflowed a second time to improve electrical contact to UBMs 94.

Semiconductor die 72, 76, and 80 are singulated along the die extension region. The die extension region is cut by a cutting tool such as a saw or laser. The cutting tool completely severs the die extension region to separate the die.

FIG. 3f illustrates semiconductor die 72 following singulation of the die extension region through a center area of THVs 86. Each semiconductor die has a similar final configuration. Contact pads 74 electrically connect through RDLs 88, THVs 86, RDLs 92, and UBMs 94 to solder bumps 100, as shown in FIG. 3f. In another embodiment, UBMs 94 is formed directly under THVs 86, which eliminates RDLs 92.

Figure 4D:
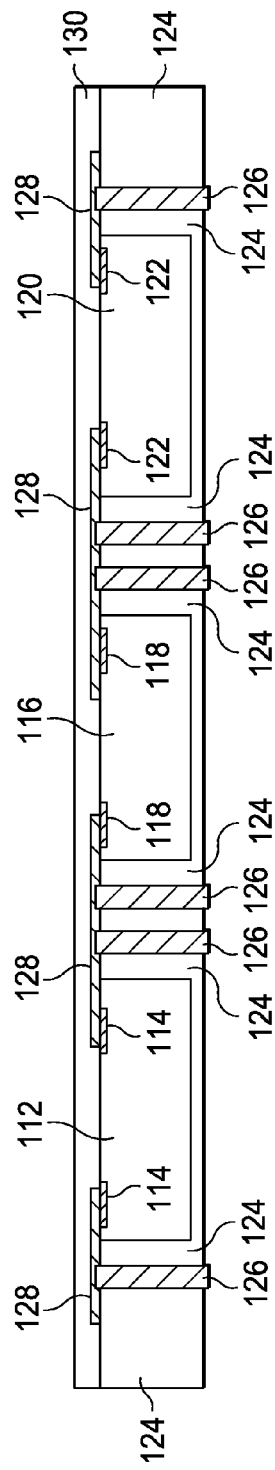

FIGS. 4a-4f illustrate an alternate embodiment of forming THVs on a periphery of a semiconductor die in a WLCSP, in this case using diced wafer expansion and lamination. In FIG. 4a, the wafer is diced and semiconductor die 112, 116, and 120 are transferred to carrier tape 110 with contact pads 114, 118, and 122 facing down toward the carrier tape.

In FIG. 4b, the carrier tape 110 is expanded by a force applied to the longitudinal axis of the tape to create a greater physical separation between the die. A lamination or encapsulation molding compound 124 is deposited around a periphery of semiconductor die 112, 116, and 120 and cured. The encapsulation molding compound 124 forms a die extension region around a periphery of semiconductor die 112, 116, and 120. The encapsulation molding compound 124 can be made with epoxy or other polymer material. The carrier tape 110 is removed.

In FIG. 4c, THVs 126 are formed in the die extension region around a periphery of semiconductor die 112, 116, and 120. An electrically conductive material is deposited in THVs 126 using an evaporation, electrolytic plating, electroless plating, or screen printing process. The conductive material can be Al, Cu, Sn, Ni, Au, or Ag.

In FIG. 4d, the semiconductor die are inverted such that the contact pads and active front side of semiconductor die 112, 116, and 120 face upward. RDLs 128 are formed between THVs 126 and the respective contact pads 114, 118, and 122 of semiconductor die 112, 116, and 120. RDLs 128 can be made with Al, AlCu, Cu, or Cu alloy. RDLs 128 operate as an intermediate conduction layer to route electrical signals between THVs 126 and contact pads 114, 118, and 122. A passivation layer 130 is formed over RDLs 128, contact pads 114, 118, and 122, and semiconductor die 112, 116, and 120 for structural support and electrical isolation. Passivation layer 130 can be made with SiO2, SiON, SixNy, PI, BCB, PBO, or other insulating material.

Figure 4E:
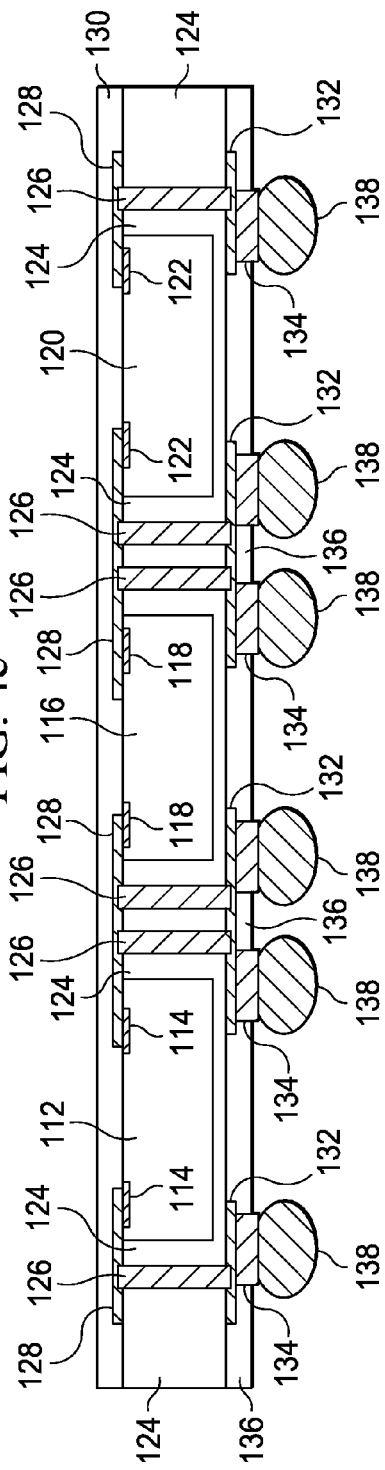

In FIG. 4e, RDLs 132 are formed on a backside of the semiconductor die, opposite the active front side, and electrically contact the backside of THVs 126. RDLs 132 can be made with Al, AlCu, Cu, or Cu alloy. A UBM 134 is deposited and patterned to electrically contact RDLs 132. In one embodiment, UBMs 134 may include a wetting layer, barrier layer, and adhesive layer. RDLs 132 operate as an intermediate conduction layer to route electrical signals between THVs 126 and UBMs 134. A passivation layer 136 is formed over RDLs 132 and encapsulation molding compound 124 for structural support and electrical isolation. Passivation layer 136 can be made with SiO2, SiON, SixNy, PI, BCB, PBO, or other insulating material.

An electrically conductive solder material is deposited over UBMs 134 through an evaporation, electrolytic plating, electroless plating, ball drop, or screen printing process. The solder material can be any metal or electrically conductive material, e.g., Sn, Pb, Ni, Au, Ag, Cu, Bi and alloys thereof. The solder material is reflowed by heating the conductive material above its melting point to form spherical balls or bumps 138. In some applications, solder bumps 138 are reflowed a second time to improve electrical contact to UBMs 134.

Semiconductor die 112, 116, and 120 are singulated along the die extension region. The die extension region is cut by a cutting tool such as a saw or laser. The cutting tool completely severs the die extension region to separate the die.

Figure 4F:
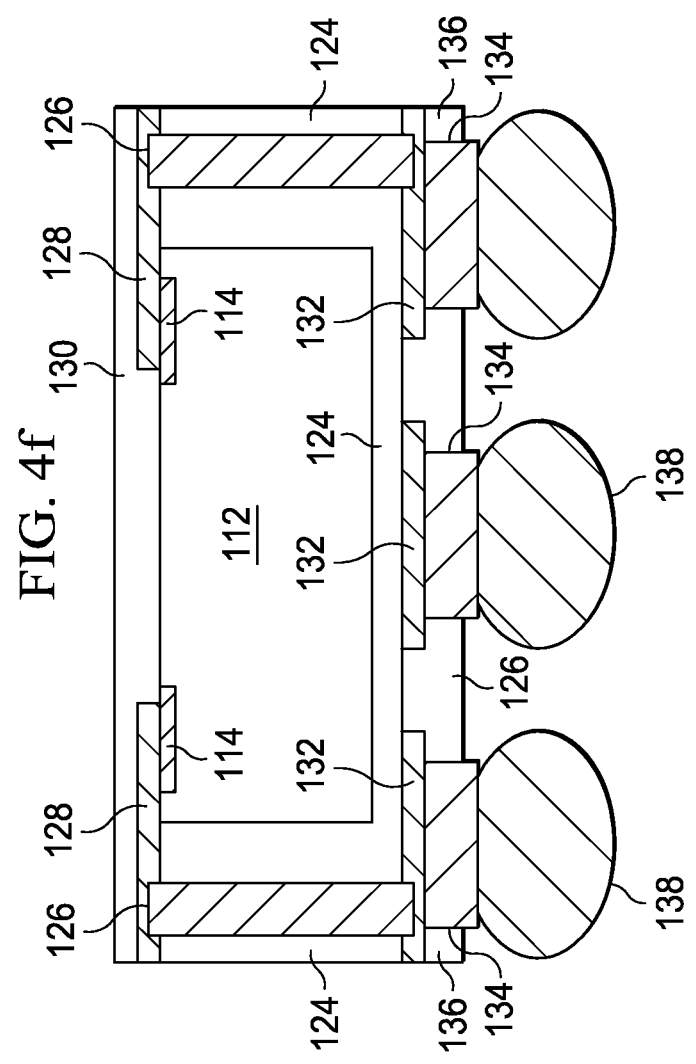

FIG. 4f illustrates semiconductor die 112 following singulation of the die extension region. The expansion of the die extension region provides greater area to form multiple offset rows of full vias and singulate through a portion of the die extension region away from the THVs. Each semiconductor die has a similar final configuration. Contact pads 114 electrically connect through RDLs 128, THVs 126, RDLs 132, and UBMs 134 to solder bumps 138, as shown in FIG. 4f. In another embodiment, UBMs 134 is formed directly under THVs 126, which eliminates RDLs 132.

Figure 5A:
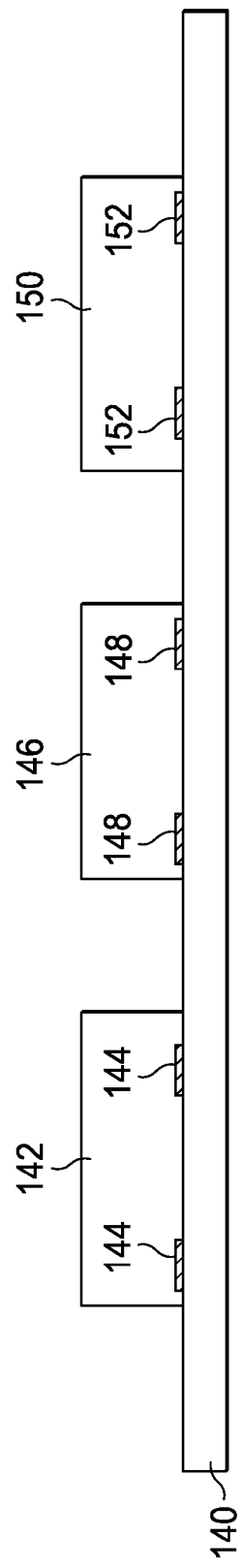

FIGS. 5a-5g illustrate an alternate embodiment of forming THVs on a periphery of a semiconductor die in a WLCSP, in this case using diced wafer expansion, kerf filing, and lamination. In FIG. 5a, the wafer is diced and semiconductor die 142, 146, and 150 are transferred to carrier tape 140 with contact pads 144, 148, and 152 facing down toward the carrier tape.

Figure 5B:
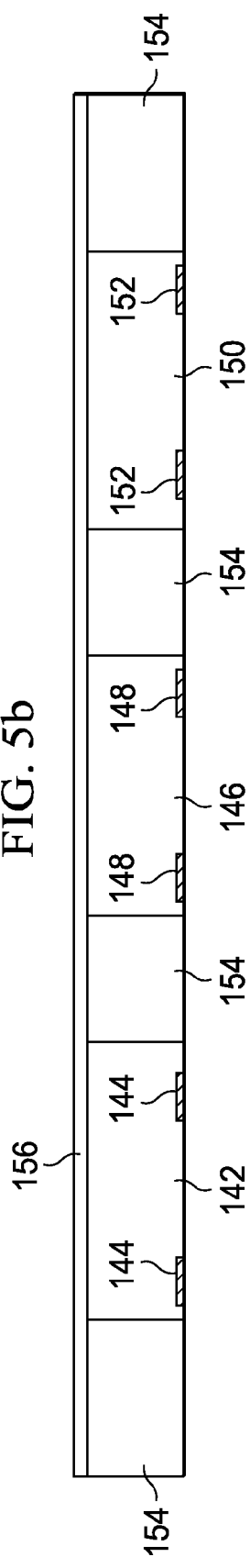

In FIG. 5b, the carrier tape 140 is expanded by a force applied to the longitudinal axis of the tape to create a greater physical separation between the die. A kerf filing process is used to form a die extension region 154 by depositing epoxy resin, passivation, stencil printed paste, or other polymer material in the area around a periphery of semiconductor die 142, 146, and 150. The backside of the die is laminated with an epoxy adhesive sheet coating 156. The carrier tape 140 is removed.

Figure 5C:
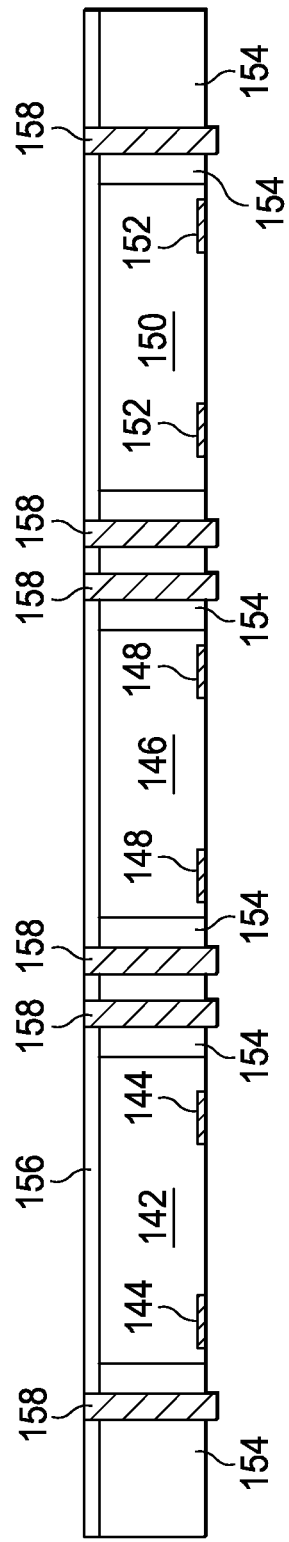

In FIG. 5c, THVs 158 are formed in die extension region 154 around a periphery of semiconductor die 142, 146, and 150. An electrically conductive material is deposited in THVs 158 using an evaporation, electrolytic plating, electroless plating, or screen printing process. The conductive material can be Al, Cu, Sn, Ni, Au, or Ag.

Figure 5D:
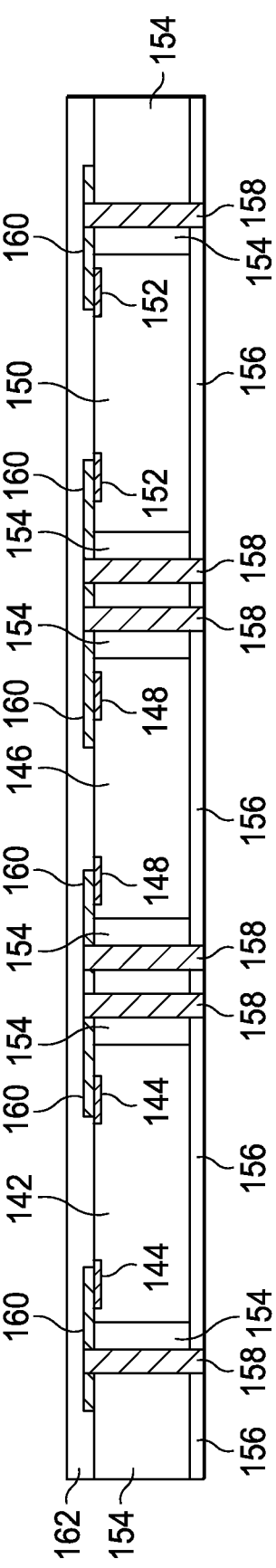
Figure 6C:
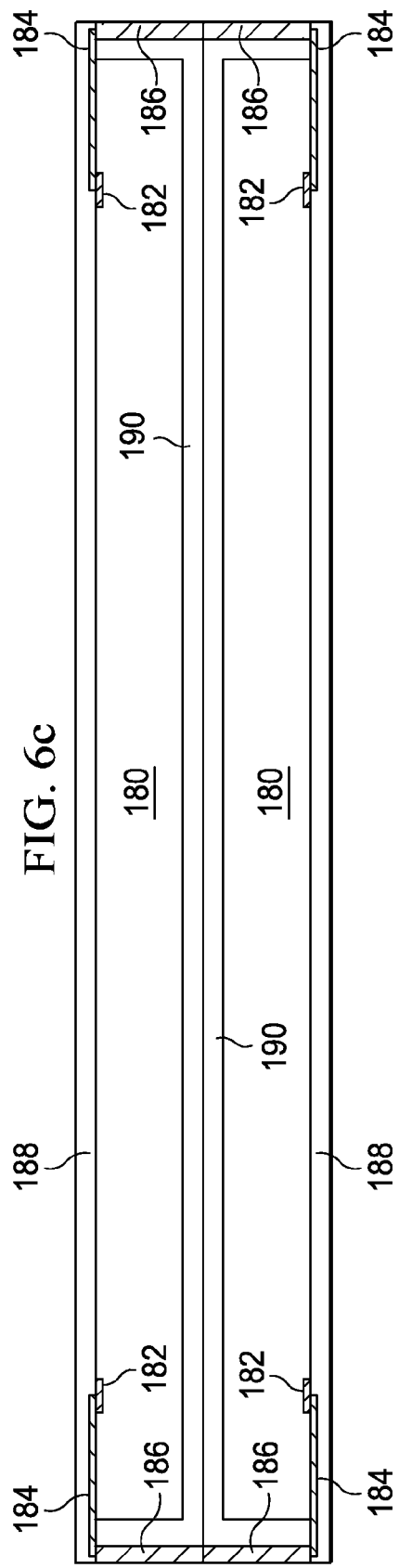

In FIG. 5d, the semiconductor die are inverted such that the contact pads and active side of semiconductor die 142, 146, and 150 face upward. RDLs 160 are formed between THVs 158 and the respective contact pads 144, 148, and 152 of semiconductor die 142, 146, and 150. RDLs 160 can be made with Al, AlCu, Cu, or Cu alloy. RDLs 160 operate as an intermediate conduction layer to route electrical signals between THVs 158 and contact pads 144, 148, and 152. A passivation layer 162 is formed over RDLs 160, contact pads 144, 148, and 152, and semiconductor die 142, 146, and 150 for structural support and electrical isolation. Passivation layer 162 can be made with SiO2, SiON, SixNy, PI, BCB, PBO, or other insulating material.

In FIG. 5e, RDLs 164 are formed on the backside of the semiconductor die, opposite the active front side, and electrically contact the backside of THVs 158. RDLs 164 can be made with Al, AlCu, Cu, or Cu alloy. A UBM 166 is deposited and patterned to electrically contact RDLs 164. In one embodiment, UBMs 166 may include a wetting layer, barrier layer, and adhesive layer. RDLs 164 operate as an intermediate conduction layer to route electrical signals between THVs 158 and UBMs 166. A passivation layer 168 is formed over RDLs 164 and epoxy adhesive sheet coating 156 for structural support and electrical isolation. Passivation layer 168 can be made with SiO2, SiON, SixNy, PI, BCB, PBO, or other insulating material.

An electrically conductive solder material is deposited over UBMs 166 through an evaporation, electrolytic plating, electroless plating, ball drop, or screen printing process. The solder material can be any metal or electrically conductive material, e.g., Sn, Pb, Ni, Au, Ag, Cu, Bi and alloys thereof. The solder material is reflowed by heating the conductive material above its melting point to form spherical balls or bumps 170. In some applications, solder bumps 170 are reflowed a second time to improve electrical contact to UBMs 166.

Semiconductor die 142, 146, and 150 are singulated along the die extension region. The die extension region is cut by a cutting tool such as a saw or laser. The cutting tool completely severs the die extension region to separate the die.

FIG. 5f illustrates semiconductor die 142 following singulation of the die extension region. The expansion of the die extension region provides greater area to form multiple offset rows of full vias and singulate through a portion of the die extension region away from the THVs. Each semiconductor die has a similar final configuration. Contact pads 144 electrically connect through RDLs 160, THVs 158, RDLs 164, and UBMs 166 to solder bumps 170, as shown in FIG. 5f. In another embodiment, UBMs 166 is formed directly under THVs 158, which eliminates RDLs 164.

In each embodiment of FIGS. 2-5, the top and bottom of the WLCSP are interconnected by THVs and RDLs so that device integration can occur by stacking the semiconductor die. The THVs are formed without drilling holes in the active area of the die or in saw streets of the wafer. Rather, the THVs are created by forming a non-conductive die extension region, e.g., molding compound or epoxy resin 50, 84, 124, or 154, around the periphery of the die. The THVs are drilled through the die extension region and filled with conductive material to interconnect the top and bottom RDLs and other conductive layers of the semiconductor die.

Further detail of the die interconnect through the THVs is shown in FIGS. 6-12. In FIGS. 6a-6b, semiconductor die 180 has contact pads 182 formed on its active surface 192. RDLs 184 electrically connect contact pads 182 to THVs 186. Depending on the electrical interconnect of the active circuits, some of the contact pads 182 are electrically isolated from adjacent THVs 186, i.e., no connecting RDL is formed. A passivation layer 188 is formed over semiconductor die 180, RDLs 184, and contact pads 182. THVs 186 are formed in molding compound 190 which operates as the die extension region as described in FIGS. 2-5. The portion of molding compound 190 on the backside of semiconductor die 180 can be removed, i.e., the backside of the die can be exposed. A plurality of semiconductor die can be stacked and interconnected through THVs 186, as shown in FIG. 6c.

Figure 7A:
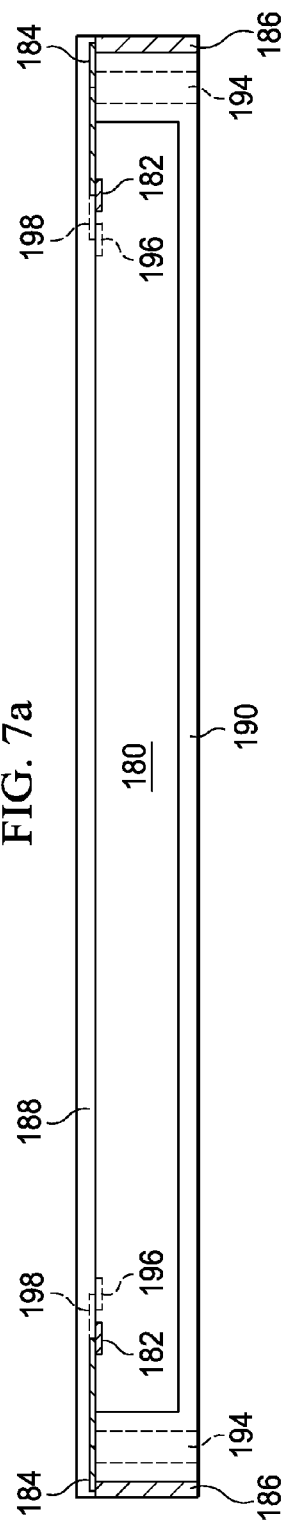
FIGS. 7a-7b illustrate a semiconductor package with through hole half and full vias formed as offset rows in a die extension region around a periphery of the die.
Figure 7B:
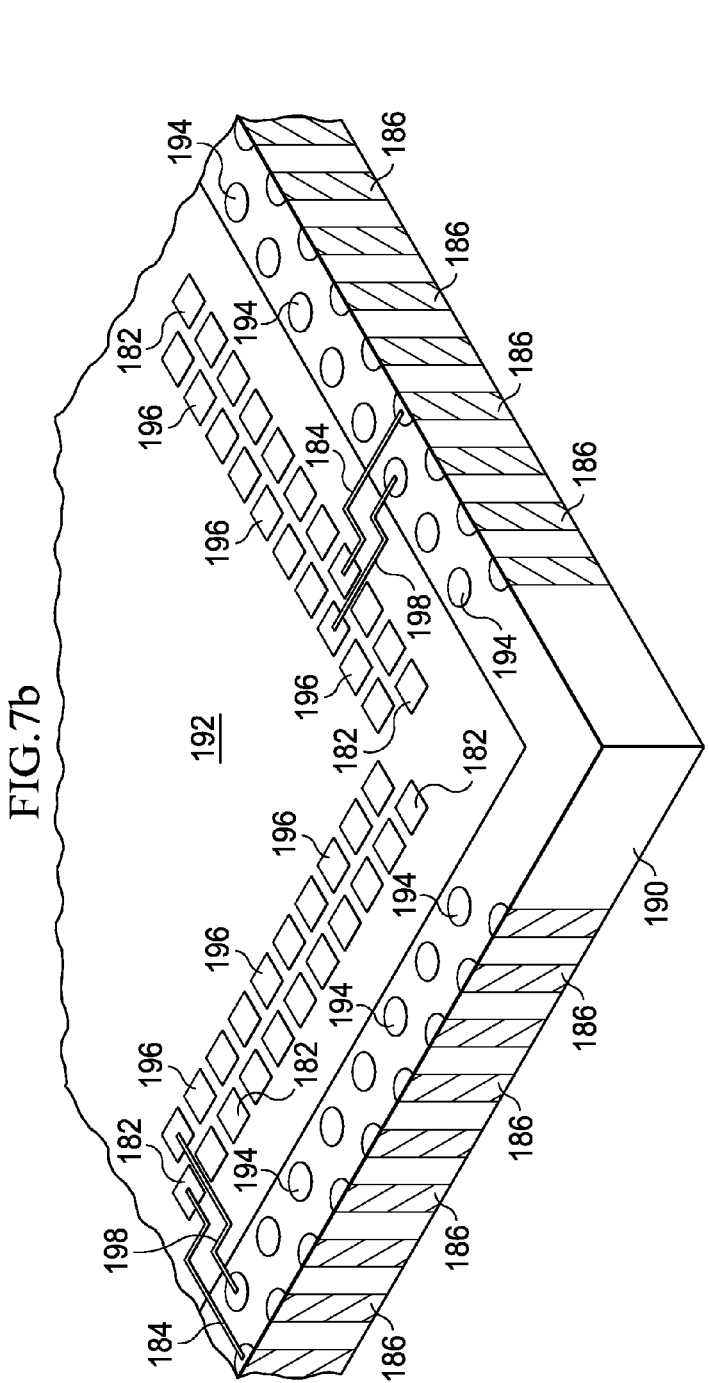

In FIGS. 7a-7b, semiconductor die 180 is shown with THVs (half vias) 186 and THVs (full vias) 194 formed in offset rows. RDLs 184 electrically connect contact pads 182 to THVs 186. RDLs 198 electrically connect contact pads 196 to THVs 194. Depending on the electrical interconnect of the active circuits, some of the contact pads 182 and 196 are electrically isolated from adjacent THVs 186 and 194, i.e., no connecting RDL is formed. A passivation layer 188 is formed over semiconductor die 180, RDLs 184 and 198, and contact pads 182 and 196. THVs 186 and 194 are formed in molding compound 190 which operates as the die extension region as described in FIGS. 2-5. The portion of molding compound 190 on the backside of semiconductor die 180 can be removed, i.e., the backside of the die can be exposed. A plurality of semiconductor die can be stacked and interconnected through THVs 186 and 194.

In FIGS. 8a-8b, semiconductor die 200 has contact pads 202 formed on its active surface 218. RDLs 204 electrically connect contact pads 202 to THVs (full vias) 206. Depending on the electrical interconnect of the active circuits, some of the contact pads 202 are electrically isolated from adjacent THVs 206, i.e., no connecting RDL is formed. A passivation layer 208 is formed over semiconductor die 200, RDLs 204, and contact pads 202. THVs 206 are formed in molding compound 210 which operates as the die extension region as described in FIGS. 2-5. THVs 206 electrically connect to RDLs 212, which in turn electrically connect through UBMs 214 to solder bumps 216. A passivation layer 220 is formed on the backside of semiconductor die 200.

In FIGS. 9a-9b, semiconductor die 200 has contact pads 202 formed on its active surface 218. Semiconductor die 200 is shown with THVs (full vias) 206 and 222 formed in offset rows. RDLs 204 electrically connect contact pads 202 to THVs 206 and 222. Depending on the electrical interconnect of the active circuits, some of the contact pads 202 are electrically isolated from adjacent THVs 206 and 222, i.e., no connecting RDL is formed. A passivation layer 225 is formed over semiconductor die 200, RDLs 204, and contact pads 202. THVs 206 and 222 are formed in molding compound 223 which operates as the die extension region as described in FIGS. 2-5. THVs 206 and 222 electrically connect to RDLs 224, which in turn electrically connect through UBMs 226 to solder bumps 228. A passivation layer 229 is formed on the backside of semiconductor die 200.

Figure 10:
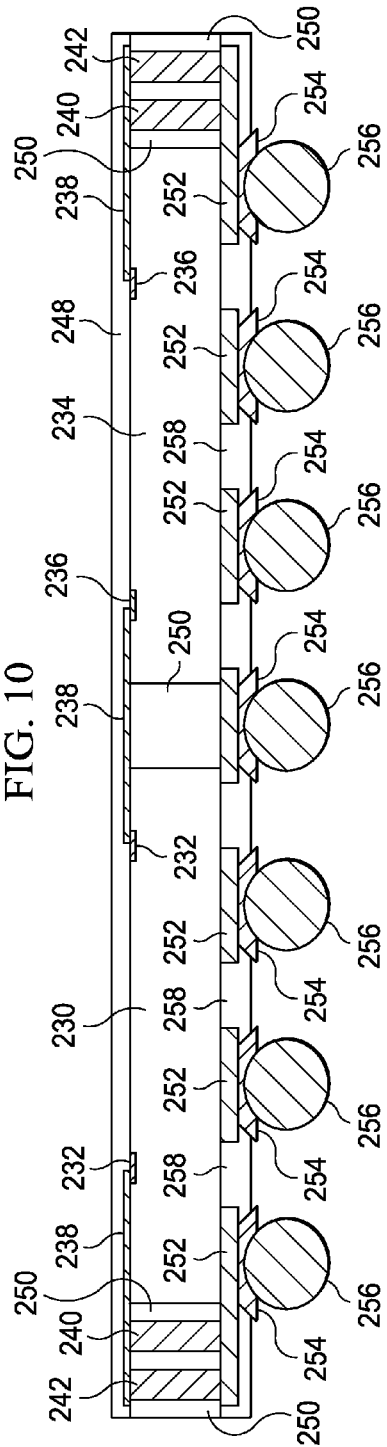
FIG. 10 illustrates a semiconductor package with multiple semiconductor die having THVs formed in a die extension region around a periphery of the die.

FIG. 10 illustrates a multi-die configuration of the WLCSP. Semiconductor die 230 has contact pads 232 formed on its active surface. Likewise, semiconductor die 234 has contact pads 236 formed on its active surface. RDLs 238 electrically connect contact pads 232 and 236 to THVs (full vias) 240 and 242. RDLs 238 also electrically connect contact pads 232 to contact pads 236. Depending on the electrical interconnect of the active circuits, some of the contact pads 232 and 236 are electrically isolated from adjacent THVs 240 and 242, i.e., no connecting RDL is formed. A passivation layer 248 is formed over semiconductor die 230 and 234, RDLs 238, and contact pads 232 and 236. THVs 240 and 242 are formed in molding compound 250 which operates as the die extension region as described in FIGS. 2-5. THVs 240 and 242 electrically connect to RDLs 252, which in turn electrically connect through UBMs 254 to solder bumps 256. A passivation layer 258 is formed on the backside of semiconductor die 230 and 234 and RDLs 252.

Figure 11:
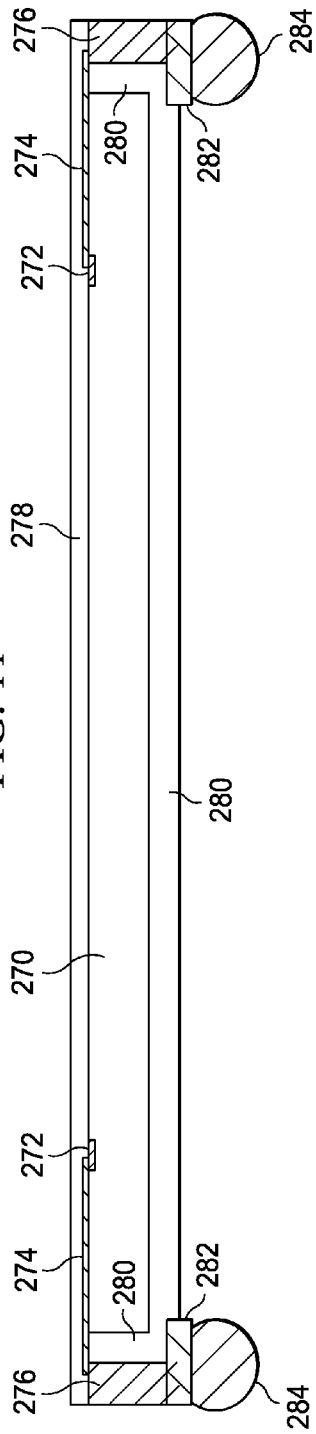
FIG. 11 illustrates a semiconductor package with THVs formed in a die extension region around a periphery of the die and UBMs for solder bumps formed directly under THVs.

In FIG. 11, semiconductor die 270 has contact pads 272 formed on its active surface. RDLs 274 electrically connect contact pads 272 to THVs (half vias) 276. Depending on the electrical interconnect of the active circuits, some of the contact pads 272 are electrically isolated from adjacent THVs 276, i.e., no connecting RDL is formed. A passivation layer 278 is formed over semiconductor die 270, RDLs 274, and contact pads 272. THVs 276 are formed in molding compound 280 which operates as the die extension region as described in FIGS. 2-5. THVs 276 electrically connect to UBMs 282, which in turn electrically connect to solder bumps 284. UBMs 282 and solder bumps 284 are formed directly under THVs 276.

Figure 12:
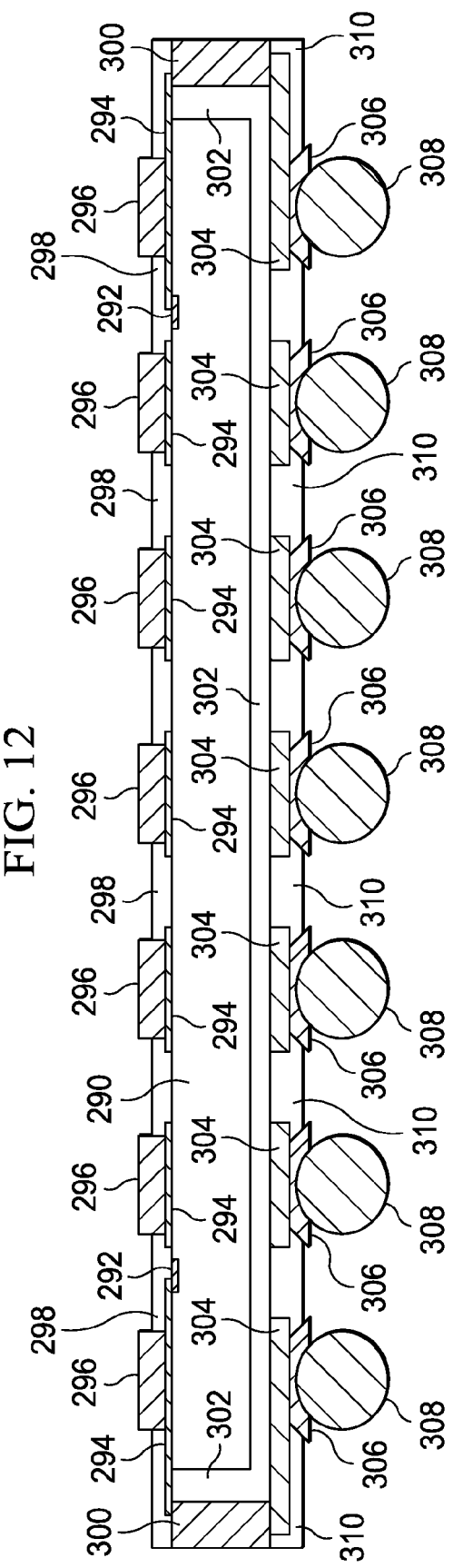
FIG. 12 illustrates a semiconductor package with THVs formed in a die extension region around a periphery of the die and backside under bump metallization.

In FIG. 12, semiconductor die 290 has contact pads 292 formed on its active surface. RDLs 294 electrically connect contact pads 292 to THVs (half vias) 300. Depending on the electrical interconnect of the active circuits, some of the contact pads 292 are electrically isolated from adjacent THVs 300, i.e., no connecting RDL is formed. UBMs 296 are formed on RDLs 294 for additional stacking. A passivation layer 298 is formed over semiconductor die 290, RDLs 294, and contact pads 292. THVs 300 are formed in molding compound 302 which operates as the die extension region as described in FIGS. 2-5. THVs 300 electrically connect to RDLs 304, which in turn electrically connect through UBMs 306 to solder bumps 308. A passivation layer 310 is formed on the backside of semiconductor die 290.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   mounting a plurality of semiconductor die to the carrier;
   forming a die extension region including a polymer material around a periphery of the semiconductor die;
   forming a plurality of vias through the die extension region;
   depositing conductive material in the vias;
   forming a first conductive layer between contact pads over an active surface of the semiconductor die and the conductive vias;
   forming a second conductive layer over a back surface of the semiconductor die, opposite the active surface, electrically connected to the conductive vias;
   forming an interconnect structure over the back surface of the semiconductor die electrically connected to the second conductive layer; and
   singulating through the conductive vias in the die extension region to separate the semiconductor die.

2. The method of claim 1, wherein the polymer material includes a molding compound or epoxy.

3. The method of claim 1, further including removing the carrier after forming the die extension region.

4. The method of claim 1, further including expanding the carrier to increase an area of the die extension region between the semiconductor die.

5. The method of claim 1, wherein forming the interconnect structure includes:
   forming an insulating layer over the second conductive layer;

forming an under bump metallization (UBM) over the second conductive layer; and forming a bump over the UBM.

6. The method of claim 1, further including forming first and second offset rows of conductive vias in the die extension region.

7. A method of making a semiconductor device, comprising:

providing a carrier;

mounting first and second singulated semiconductor die to the carrier;

forming an insulating material between the first and second singulated semiconductor die;

forming first and second rows of conductive vias through the insulating material between the first and second singulated semiconductor die; and forming a first conductive layer over a first surface of the first singulated semiconductor die electrically connected to the first or second row of conductive vias.

8. The method of claim 7, further including forming a second conductive layer over a second surface of the first singulated semiconductor die, opposite the first surface, electrically connected to the first or second row of conductive vias.

9. The method of claim 8, further including forming an interconnect structure over the second surface of the first singulated semiconductor die electrically connected to the second conductive layer.

10. The method of claim 7, further including forming an interconnect structure over the first surface of the first singulated semiconductor die electrically connected to the first conductive layer.

11. The method of claim 7, wherein the insulating material includes a polymer, molding compound, or epoxy.

12. The method of claim 7, further including expanding the carrier to increase an area between the first and second singulated semiconductor die.

13. The method of claim 7, further including:

stacking a plurality of semiconductor devices; and electrically connecting the stacked semiconductor devices through the first or second row of conductive vias.

14. A method of making a semiconductor device, comprising:

providing a semiconductor die;

forming an insulating material in a peripheral region around the semiconductor die;

forming first and second rows of conductive vias through the insulating material along an edge of the semiconductor die; and forming a first conductive layer over a first surface of the semiconductor die electrically connected to the first or second row of conductive vias.

15. The method of claim 14, further including forming a second conductive layer over a second surface of the semiconductor die, opposite the first surface, electrically connected to the first or second row of conductive vias.

16. The method of claim 15, further including forming an interconnect structure over the second surface of the semiconductor die electrically connected to the second conductive layer.

17. The method of claim 14, further including forming an interconnect structure over the first surface of the semiconductor die electrically connected to the first conductive layer.

18. The method of claim 14, wherein the insulating material includes a polymer, molding compound, or epoxy.

19. The method of claim 14, further including:

stacking a plurality of semiconductor devices; and electrically connecting the stacked semiconductor devices through the first or second row of conductive vias.

20. A method of making a semiconductor device, comprising:

providing a carrier;

mounting first and second singulated semiconductor die to the carrier;

forming an insulating material between the first and second singulated semiconductor die; and forming a plurality of first conductive vias through the insulating material between the first and second singulated semiconductor die.

21. The method of claim 20, further including forming a first conductive layer over a first surface of the first singulated semiconductor die and electrically connected to the conductive vias.

22. The method of claim 20, further including singulating through the conductive vias to separate the first and second semiconductor die.

23. The method of claim 20, further including forming a second conductive layer over a second surface of the first singulated semiconductor die opposite the first surface and electrically connected to the conductive vias.

24. The method of claim 20, further including forming a plurality of second conductive vias through the insulating material between the first and second singulated semiconductor die with the first and second conductive vias arranged in offset rows.

25. The method of claim 24, further including:

stacking a plurality of semiconductor devices; and electrically connecting the stacked semiconductor devices through the first or second conductive vias.

* * * * *